(12) United States Patent
Lin et al.

(10) Patent No.: US 8,368,445 B2
(45) Date of Patent: Feb. 5, 2013

(54) DELAY-LOCKED LOOP

(75) Inventors: Chih-Hsien Lin, Hsinchu County (TW);
Chih-Wei Mu, New Taipei (TW);
Ming-Shih Yu, New Taipei (TW)

(73) Assignee: Faraday Technology Corp.,
Science-Based Industrial Park, Hsin-Chu (TW)

( * ) Notice: Subject to any disclaimer, the term of this patent is extended or adjusted under 35 U.S.C. 154(b) by 11 days.

(21) Appl. No.: 13/174,798

(22) Filed: Jul. 1, 2011

(65) Prior Publication Data

US 2013/0002320 A1    Jan. 3, 2013

(51) Int. Cl.
*H03L 7/06* (2006.01)
(52) U.S. Cl. ......................... 327/158; 327/149
(58) Field of Classification Search .................. 327/149, 327/158
See application file for complete search history.

(56) References Cited

U.S. PATENT DOCUMENTS

| | | | | |
|---|---|---|---|---|
| 5,473,639 A * | 12/1995 | Lee et al. | ....................... | 375/376 |
| 6,119,242 A * | 9/2000 | Harrison | ....................... | 713/503 |
| 6,667,643 B2 | 12/2003 | Ko | | |
| 6,927,635 B2 * | 8/2005 | Miki et al. | ..................... | 331/1 A |
| 7,157,949 B2 * | 1/2007 | Chen et al. | ..................... | 327/158 |
| 7,209,533 B1 | 4/2007 | Nguyen et al. | | |
| 7,233,182 B1 * | 6/2007 | Savoj | ............................ | 327/141 |
| 7,298,191 B2 * | 11/2007 | Wu et al. | ........................ | 327/158 |
| 7,366,269 B2 * | 4/2008 | Ishida et al. | ................... | 375/368 |
| 2003/0076142 A1 * | 4/2003 | Ko | ................................ | 327/158 |
| 2005/0206418 A1 * | 9/2005 | Chen et al. | ..................... | 327/158 |
| 2005/0238129 A1 * | 10/2005 | Ishida et al. | ................... | 375/376 |
| 2006/0132205 A1 * | 6/2006 | Wu et al. | ........................ | 327/158 |
| 2006/0250192 A1 * | 11/2006 | Hsieh | ............................... | 331/16 |
| 2010/0013530 A1 | 1/2010 | Kim et al. | | |

* cited by examiner

*Primary Examiner* — Adam Houston
(74) *Attorney, Agent, or Firm* — Winston Hsu; Scott Margo (57) ABSTRACT

A delay-locked loop (DLL) which receives a reference clock signal and outputs an output clock signal is provided. The DLL includes a phase detector, a delay chain, an anti-false lock (AFL) circuit, and a loop filter. The phase detector outputs a first comparison signal according to a phase comparison between the reference clock signal and the output clock signal. The delay chain generates a plurality of strobe clock signals and the output clock signal by delaying the reference clock signal for different intervals. The AFL circuit outputs a second comparison signal according to a phase comparison between the reference clock signal and the strobe clock signals. The loop filter controls the delay time of the output clock signal according to the first and the second comparison signals in order to lock the delay time of the output clock signal at a preset value.

13 Claims, 8 Drawing Sheets

DELAY-LOCKED LOOP

BACKGROUND OF THE INVENTION

1. Field of the Invention

The invention relates generally to a delay-locked loop (DLL), and more particularly, to a DLL capable of preventing a false lock.

2. Description of Related Art

Figure 1:
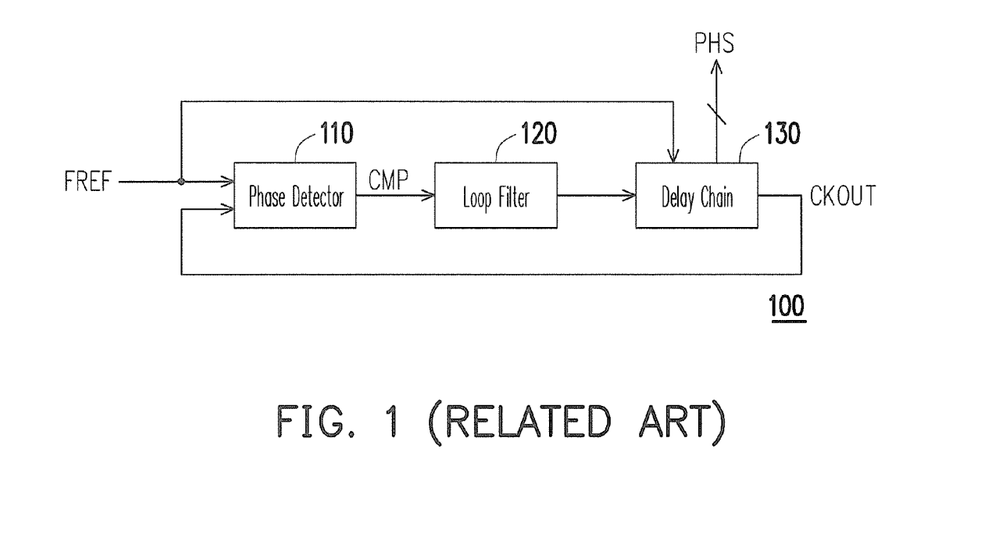
FIG. 1 is a schematic diagram of a conventional delay-locked loop (DLL).

FIG. 1 is a schematic diagram of a conventional DLL 100. A DLL 100 receives an external reference clock signal FREF and outputs an output clock signal CKOUT for an internal circuit. The DLL 100 includes a phase detector 110, a loop filter 120, and a delay chain 130. The phase detector 110 outputs a comparison signal CMP according to a comparison between the reference clock signal FREF and the output clock signal CKOUT. The delay chain 130 generates the output clock signal CKOUT by delaying the reference clock signal FREF. The loop filter 120 is a low-pass filter capable of filtering noise from the comparison signal CMP and simultaneously controlling a delay time of the output clock signal CKOUT according to the comparison signal CMP.

An ideal DLL locks the output clock signal CKOUT to lag one cycle after the reference clock signal FREF. In other words, the loop filter 120 should control the delay chain 130 so the length of the delay time of the output clock signal CKOUT is set at one cycle. However, since the initial delay of the delay chain when the circuit is turned on is not a fixed value, a false lock results if an initial non-ideal delay occurs.

Figure 2:
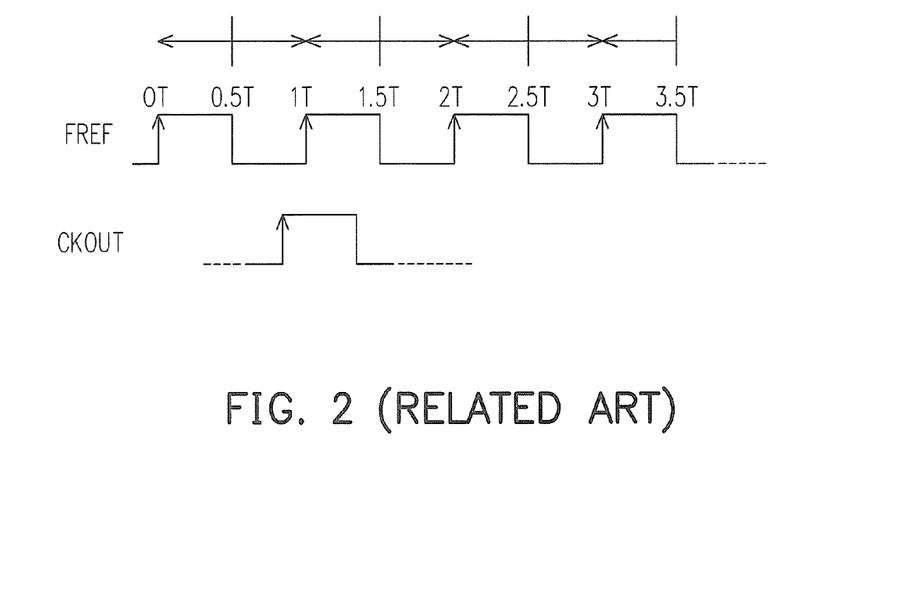
FIGS. 2 and 3 are schematic diagrams of the clock signals of the DLL depicted in FIG. 1.
Figure 3:
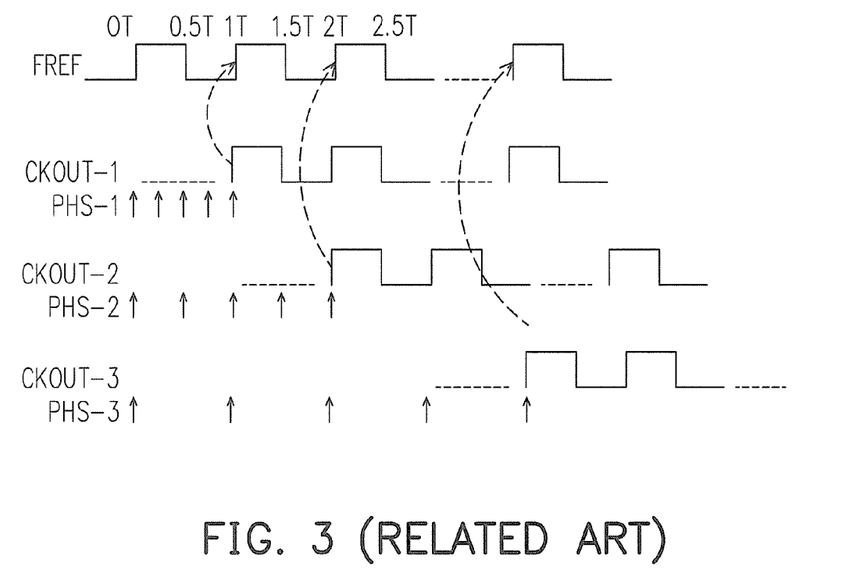

An operable delay range of the conventional DLL is from 0.5 T to 1.5 T as shown in FIG. 2, in which T is a cycle of the reference clock signal FREF. That is to say, as long as the initial delay time of the clock output clock signal CKOUT relative to the reference clock signal FREF is between 0.5 T and 1.5 T, as shown by CKOUT in FIG. 2, the DLL 100 correctly locks the delay time of the output clock signal CKOUT at 1 T. Besides generating the output clock signal CKOUT, the delay chain 130 also generates five strobe clock signals PHS for the internal circuit. Moreover, if the delay time of the output clock signal CKOUT is x, then the delay times of the five strobe clock signals are 0, (¼)x, (½)x, (¾)x, and x, respectively. FIG. 3 depicts the reference clock signal FREF and an output clock signal CKOUT-1 correctly locked at 1 T. Since the output clock signal CKOUT-1 is locked at the correct delay time, the five strobe clock signals generated by the delay chain are also accurate.

When the initial delay time of the clock output clock signal CKOUT relative to the reference clock signal FREF is outside the range between 0.5 T to 1.5 T, a false lock occurs. As shown in FIG. 2, when the initial delay time of the output clock signal CKOUT is between 1.5 T and 2.5 T, a lock occurs at 2 T. Moreover, when the initial delay time of the output clock signal CKOUT is between 2.5 T and 3.5 T, a lock occurs at 3 T, and so on. A false lock caused by an initial delay time of the output clock signal CKOUT that is greater than 1.5 T is referred to as a harmonic lock, and incorrect strobe clock signals results from the harmonic lock. As shown in FIG. 3, the output clock signal CKOUT-2 is incorrectly locked at 2 T. Due to the fixed proportional relationship of the delay time, the five strobe clock signals PHS-2 corresponding to the output clock signal CKOUT-2 are incorrect and unusable. The output clock signal CKOUT-3 is incorrectly locked at even later integral cycles, and thus the five strobe clock signals PHS-3 corresponding thereto are also inaccurate.

As shown in FIG. 2, when the initial delay time of the output clock signal CKOUT is less than 0.5 T, a lock tends to occur at 0 T. This type of false lock is referred to as a stuck lock, and incorrect strobe clock signals are generated by the delay chain due to the stuck lock.

The two faulty phenomena of the harmonic lock and the stuck lock are referred to as the false lock.

SUMMARY OF THE INVENTION

Accordingly, the invention is directed to a delay-locked loop (DLL) capable of effectively preventing a false lock.

The invention provides a DLL for receiving a reference clock signal and outputting an output clock signal. The DLL includes a phase detector, a delay chain, an anti-false lock (AFL) circuit, and a loop filter. The phase detector outputs a first comparison signal according to a phase comparison between the reference clock signal and the output clock signal. The delay chain generates a plurality of strobe clock signals and the output clock signal by delaying the reference clock signal for different intervals. The AFL circuit outputs a second comparison signal according to a phase comparison between the reference clock signal and the strobe clock signals. The loop filter controls a delay time of the output clock signal according to the first and second comparison signals in order to lock the delay time of the output clock signal at a preset value.

Embodiments of the invention employ structurally simple and compact circuits to prevent the false luck. Moreover, the DLL according to embodiments of the invention has an easily adjustable false lock detection range and operable range.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 4:
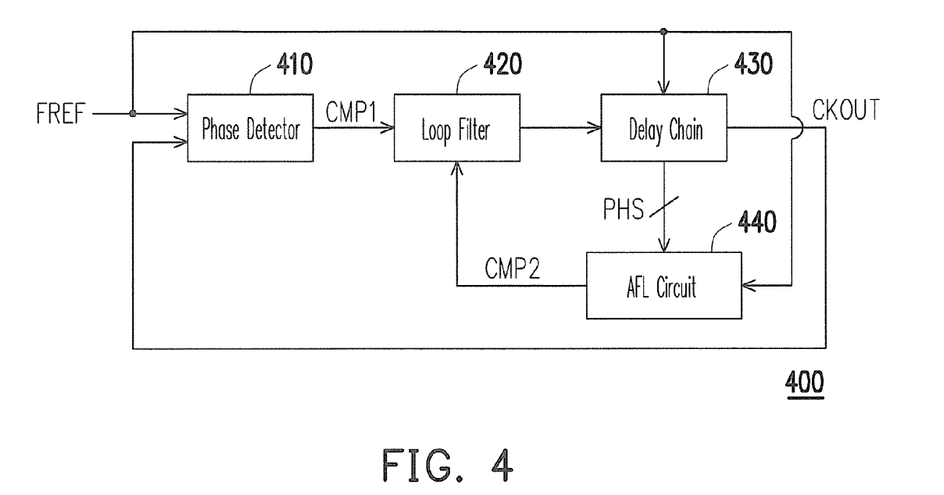
FIG. 4 is a schematic diagram of a delay-locked loop (DLL) according to an embodiment of the invention.

FIG. 4 is a schematic diagram of a delay-locked loop (DLL) 400 according to an embodiment of the invention. The DLL 400 receives a reference clock signal FREF and outputs an output clock signal CKOUT. The DLL 400 includes a phase detector 410, a delay chain 430, an anti-false lock (AFL) circuit 440, and a loop filter 420. The phase detector 410 outputs a comparison signal CMP1 according to a phase comparison between the reference clock signal FREF and the output clock signal CKOUT. The delay chain 430 generates a plurality of strobe clock signals PHS and the output clock signal CKOUT by delaying the reference clock signal for different intervals. Specifically, a preset ratio is set between a delay time of each of the strobe clock signals PHS and a delay time of the output clock signal CKOUT. The AFL circuit 440 outputs a comparison signal CMP2 according to a phase comparison between the reference clock signal FREF and the strobe clock signals PHS. The loop filter 420 is a low-pass filter that filters noise from the comparison signal CMP1, and the loop filter 420 simultaneously controls the delay chain 430 according to the comparison signals CMP1 and CMP2 in order to lock the delay time of the output clock signal CKOUT at a preset value.

In the present embodiment, the preset value is equal to a cycle of the reference clock signal FREF. However, a different preset value may be configured if necessary.

The loop filter 420 and the delay chain 430 may be implemented in analog or digital mode. When implemented in analog mode, the loop filter 420 is an analog loop filter, and the delay chain 430 is an analog voltage control delay line. When implemented in digital mode, the loop filter 420 is a digital loop filter, and the delay chain 430 is a digital voltage control delay line.

Figure 5:
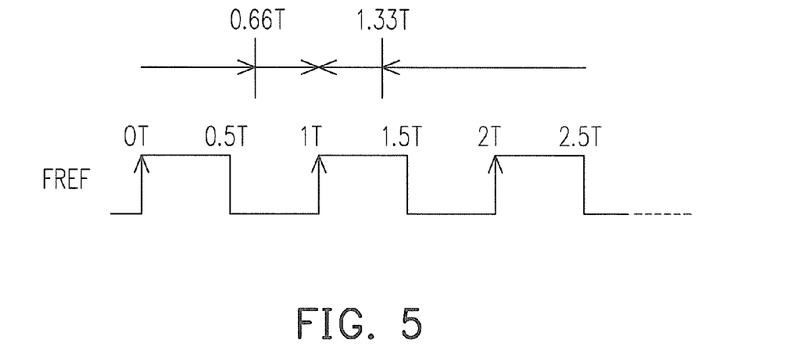
FIG. 5 is a schematic diagram of a comparison signal and a clock signal of the DLL depicted in FIG. 4.

FIG. 5 depicts the reference clock signal FREF of the DLL 400 and three states of the comparison signal CMP2, in which T is a cycle of the reference clock signal FREF. As shown in FIG. 5, different delay times of the output clock signal CKOUT relative to the reference clock signal FREF causes the comparison signal CMP2 to reside in a stuck lock state, a normal state, or a harmonic lock state. The delay time has two boundary points. In the present embodiment, the boundary points are 0.66 T and 1.33 T, respectively, and the two boundary points define a false lock detection range of the AFL circuit 440.

When the AFL circuit 440 detects the delay time of the output clock signal CKOUT relative to the reference clock signal FREF is between 0.66 T to 1.33 T, a normal state of the comparison signal CMP2 is outputted. At this time, the loop filter 420 acts like a conventional loop filter, and the loop filter 420 controls the delay time of the output clock signal CKOUT according to the comparison signal CMP1 in order to lock the delay time of the output clock signal CKOUT at a preset value of 1 T.

When the AFL circuit 440 detects the delay time of the output clock signal CKOUT relative to the reference clock signal FREF is greater than 1.33 T, a harmonic lock state of the comparison signal CMP2 is outputted to prevent harmonic lock. At this time, the loop filter 420 directly shortens the delay time of the output clock signal CKOUT until the comparison signal CMP2 is in the normal state.

When the AFL circuit 440 detects the delay time of the output clock signal CKOUT relative to the reference clock signal FREF is less than 0.66 T, a stuck lock state of the comparison signal CMP2 is outputted to prevent stuck lock. At this time, the loop filter 420 directly elongates the delay time of the output clock signal CKOUT until the comparison signal CMP2 is in the normal state.

As shown in the description above, when the comparison signal CMP2 is in the stuck lock state or the harmonic lock state, the loop filter 420 adjusts the delay time of the output clock signal CKOUT according to the comparison signal CMP2 of the AFL circuit 440. When the comparison signal CMP2 is in the normal state, the loop filter 420 returns to the conventional mechanism and adjusts the delay time of the output clock signal CKOUT according to the comparison signal CMP1 of the phase detector 410. Although the operational range of the conventional DLL is only between 0.5 T to 1.5 T, by adopting the afore-described mechanism of the present embodiment, even when the initial delay time of the output clock signal CKOUT is outside of the 0.5 T to 1.5 T range, the output clock signal CKOUT can still be correctly locked at the preset value of 1 T.

As to how the AFL circuit 440 detects the delay time of the output clock signal CKOUT and the corresponding relationship of the two boundary points, further description thereof is provided hereinafter.

Any conventional implementations may be adopted for the control mechanism of the loop filter 420 on the delay time of the output clock signal CKOUT. For example, the loop filter 420 may include a counter, and the delay chain 430 may control the delay times of the output clock signal CKOUT and each of the strobe clock signals PHS according to a count value of the counter, in which the delay time becomes longer as the count value increases. When the comparison signal CMP2 is in the harmonic lock state, the counter of the loop filter 420 decreases the count value. When the comparison signal CMP2 is in the stuck lock state, the counter of the loop filter 420 increases the count value. When the delay time of the output clock signal CKOUT is within the range of 0.66 T to 1.33 T, the comparison signal CMP2 enters the normal state. At this time, the loop filter 420 conventionally controls the count value according to the comparison signal CMP1 in order to correctly lock the delay time of the output clock signal CKOUT at the preset value of 1 T.

Figure 6:
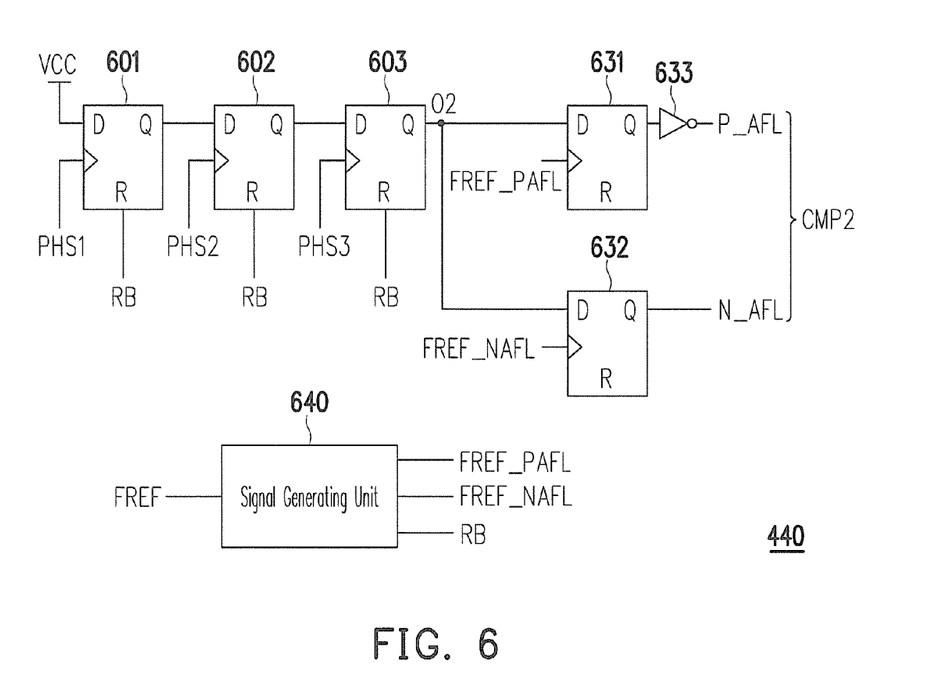
FIG. 6 is a schematic diagram of an anti-false lock (AFL) circuit according to an embodiment of the invention.

FIG. 6 is a schematic diagram of the AFL circuit 440 according to an embodiment of the invention. The AFL circuit 440 includes five storage units 601-603, 631, 632, an inverter 633, and a signal generating unit 640. Each of the storage units in the present embodiment is a D flip-flop having an input terminal D, an output terminal Q, a reset terminal R, and a trigger terminal depicted by a small triangular symbol in FIG. 6. The input terminal D receives an input signal, the output terminal Q outputs a signal stored by the corresponding D flip-flop, and the trigger terminal receives a signal for triggering the storage operation. The reset terminal R of the storage units 601-603 receives a reset signal RB. In other embodiments of the invention, a part or all of the storage units 601-603, 631, and 632 may be replaced by other devices having the same triggered storage and reset functions, such as latches and/or sample-and-hold circuits.

The storage units 601-603 are serially coupled in order, and thus the storage units 601-603 may be referred to as serial storage units. The storage units 601-603 respectively receive strobe clock signals PHS-PHS3 as trigger signals. Moreover, each of the serial storage units 601-603 receives an input signal. When the corresponding one of the strobe clock signals is enabled, each of the serial storage units 601-603 stores the corresponding input signal. The input signal of the first serial storage unit 601 is a preset voltage VCC, and the other input signals received by the serial storage units 602 and 603 are the input signals stored by the previous serial storage unit. Moreover, the input signal stored by the last serial storage unit 603 is outputted as an internal signal O2. The preset voltage VCC of the present embodiment is a corresponding voltage of logic 1. The serial connected structure of the storage units 601-603 can achieve a phase comparison of the reference clock signal FREF and the strobe clock signals PHS.

The signal generating unit 640 generates two clock signals FREF_PAFL and FREF_NAFL by delaying the reference clock signal FREF for different intervals. Moreover, the signal generating unit 640 also outputs the reset signal RB, and each of the serial storage units 601-603 resets the input signal stored therein when the reset signal RB is enabled.

The storage unit 631 receives the internal signal O2 and the clock signal FREF_PAFL, and the storage unit 631 stores the internal signal O2 when the clock signal FREF_PAFL is enabled. The storage unit 632 receives the internal signal O2 and the clock signal FREF_NAFL, and the storage unit 632 stores the internal signal O2 when the clock signal FREF_NAFL is enabled.

The comparison signal CMP2 outputted by the AFL circuit 440 is composed of a harmonic lock signal P_AFL and a stuck lock signal N_AFL. In the present embodiment, the inverter 633 receives the internal signal O2 stored by the storage unit 631 and outputs the harmonic lock signal P_AFL. Therefore, the harmonic lock signal P_AFL is an inverted signal of the internal signal O2 stored by the storage unit 631. When the harmonic lock signal P_AFL is enabled, the value thereof is logic 1, and when the harmonic lock signal P_AFL is disabled, the value thereof is logic 0. However, the invention is not limited thereto. In other embodiments, the inverter 633 may be omitted, so that the harmonic lock signal P_AFL is the internal signal O2 stored by the storage unit 631. Under this condition, when the harmonic lock signal P_AFL is enabled, the value thereof is logic 0, and when the harmonic lock signal P_AFL is disabled, the value thereof is logic 1.

In the present embodiment, the stuck lock signal N_AFL is the internal signal O2 stored by the storage unit 632. When the stuck lock signal N_AFL is enabled, the value thereof is logic 1, and when the stuck lock signal N_AFL is disabled, the value thereof is logic 0. However, the invention is not limited thereto. In other embodiments, an inverter may be disposed between the output terminal Q of the storage unit 632 and the output terminal of the stuck lock signal N_AFL, in which the stuck lock signal N_AFL is the inverted signal of the internal signal O2 stored by the storage unit 632. Under this condition, when the stuck lock signal N_AFL is enabled, the value thereof is logic 0, and when the stuck lock signal N_AFL is disabled, the value thereof is logic 1.

When the harmonic lock signal P_AFL and the stuck lock signal N_AFL are both disabled, the comparison signal CMP2 is in the normal state. When the harmonic lock signal P_AFL is enabled and the stuck lock signal N_AFL is disabled, the comparison signal CMP2 is in the harmonic lock state. When the harmonic lock signal P_AFL is disabled and the stuck lock signal N_AFL is enabled, the comparison signal CMP2 is in the stuck lock state.

Figure 7:
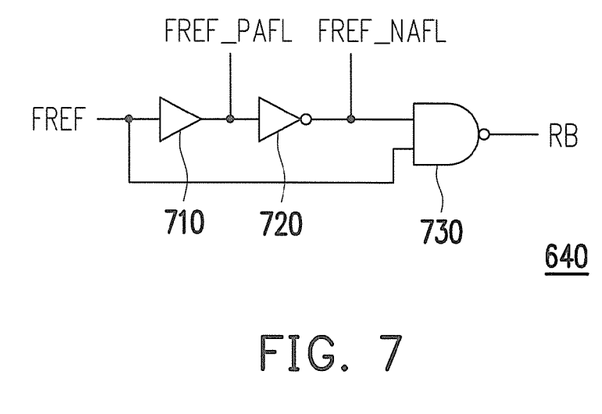
FIG. 7 is a schematic diagram of a signal generating unit according to an embodiment of the invention.

FIG. 7 is a schematic diagram of a signal generating unit 640 according to an embodiment of the invention. The signal generating unit 640 includes a buffer 710, an inverter 720, and an NAND gate 730. The buffer 710 receives the reference clock signal FREF and outputs the clock signal FREF_PAFL. One of the purpose for the buffer 710 is to counter the non-ideal delay caused by elements in the AFL circuit 440. The inverter 720 receives the clock signal FREF_PAFL and outputs the clock signal FREF_NAFL. The NAND gate 730 receives the clock signal FREF_NAFL and the reference clock signal FREF and outputs the reset signal RB. As shown by the circuit in FIG. 7, in the present embodiment, the delay time of the clock signal FREF_PAFL may be viewed as 1 T, and the delay time of the clock signal FREF_NAFL may be viewed as 0.5 T.

Figure 8:
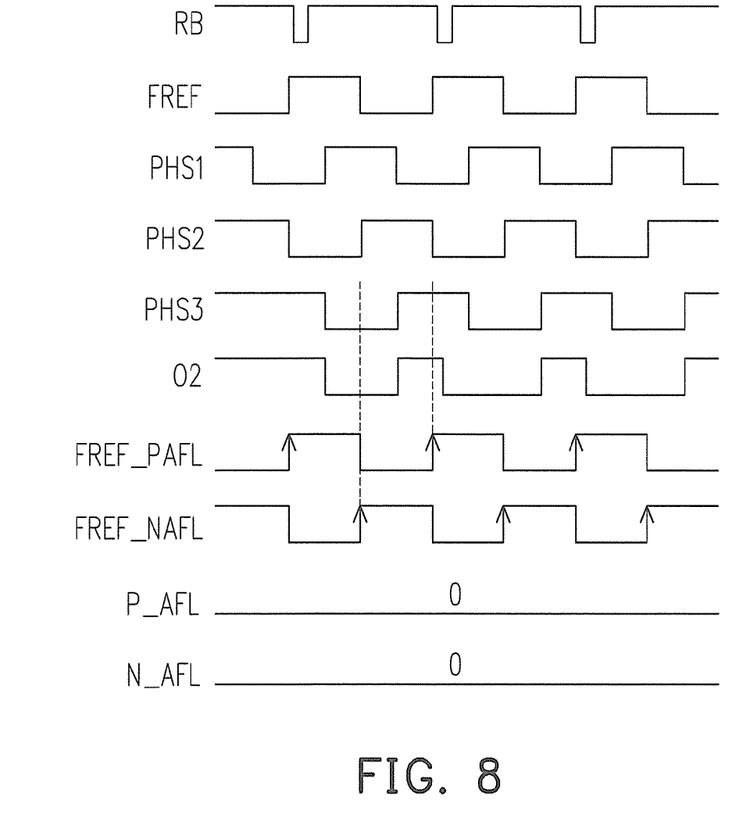
FIGS. 8-10 are signal timing diagrams of a DLL according to an embodiment of the invention.
Figure 9:
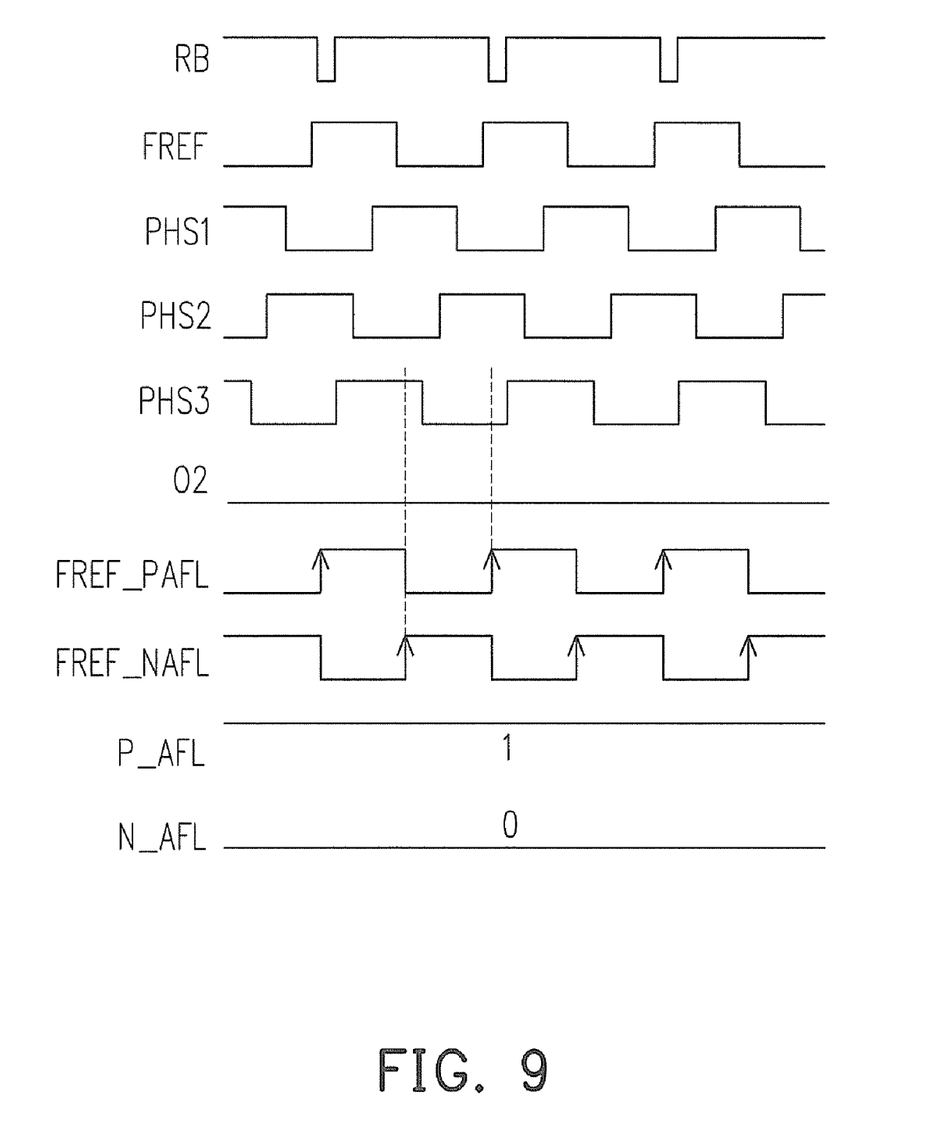
Figure 10:
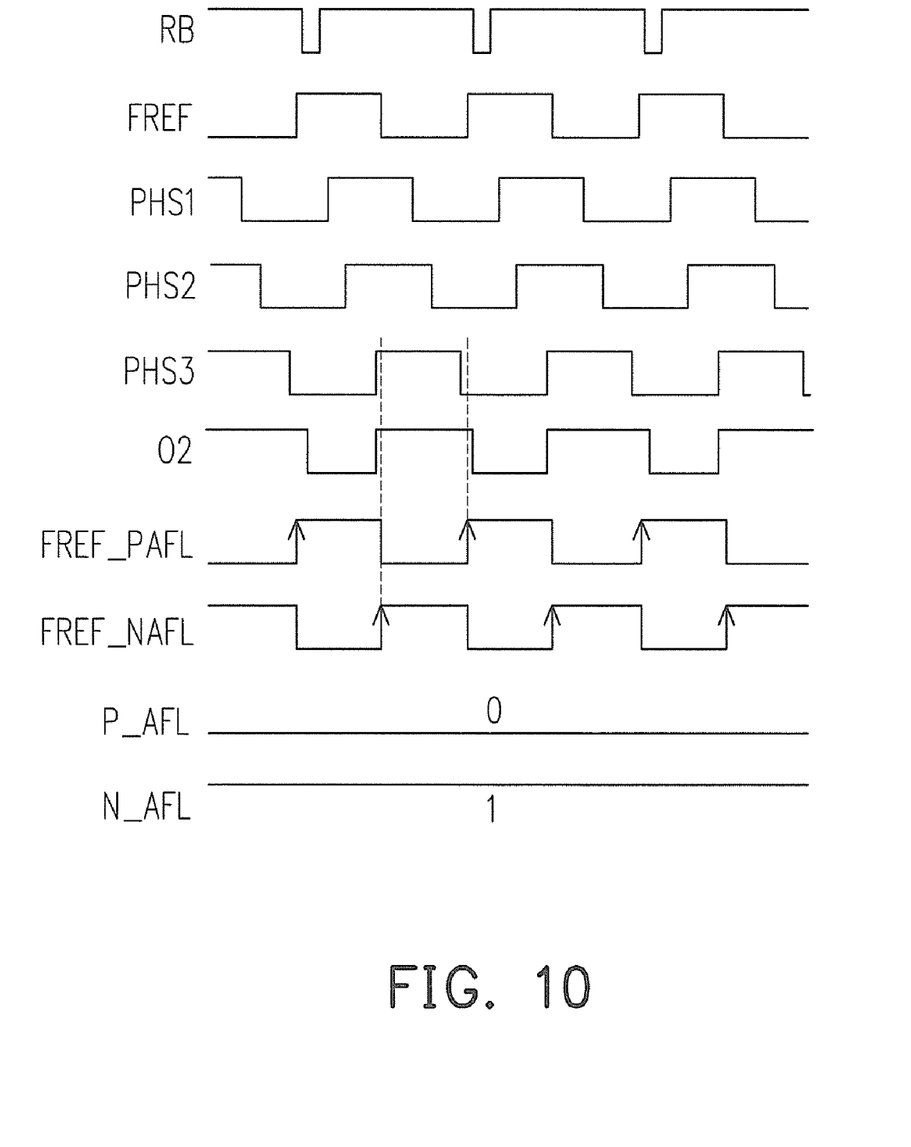

FIGS. 8-10 are signal timing diagrams of the DLL 400 according to an embodiment of the invention. In the present embodiment, the delay times of the strobe clock signals PHS1-PHS3 are respectively $\frac{1}{4}$, $\frac{1}{2}$, and $\frac{3}{4}$ of the delay time of the output clock signal CKOUT. FIG. 8 depicts one example of signal timing when the comparison signal CMP2 is in the normal state, in which the delay of the strobe clock signal PHS3 puts the harmonic lock signal P_AFL and the stuck lock signal N_AFL in the disabled state.

FIG. 9 depicts one example of signal timing when the comparison signal CMP2 is in the harmonic lock state, in which the strobe clock signal PHS3 lags behind the clock signal FREF_PAFL such that the internal signal O2 is stored in the storage unit 631 before rising to logic 1, thereby enabling the harmonic lock signal P_AFL. At this time, the stuck lock signal N_AFL is disabled, so that the comparison signal CMP2 is in the harmonic lock state. Accordingly, the conditions in which the comparison signal CMP2 enters the harmonic lock state are:

$$(\tfrac{3}{4})*x>T \qquad (1)$$

in which x is the delay time of the output clock signal CKOUT, and this condition can be computed as:

$$x>(\tfrac{4}{3})*T=1.33T \qquad (2).$$

Moreover, the computed value of 1.33 T is the boundary point of the normal state and the harmonic lock state as shown in FIG. 5.

FIG. 10 depicts one example of signal timing when the comparison signal CMP2 is in the stuck lock state, in which the strobe clock signal PHS3 leads the clock signal FREF_PAFL such that the internal signal O2 also leads the clock signal FREF_NAFL, thereby enabling the stuck lock signal N_AFL. At this time, the harmonic lock signal P_AFL is disabled, so that the comparison signal CMP2 is in the stuck lock state. Accordingly, the conditions in which the comparison signal CMP2 enters the stuck lock state are:

$$(\tfrac{3}{4})*x<(\tfrac{1}{2})*T \qquad (3)$$

and this condition can be computed as:

$$x<(\tfrac{2}{3})*T=0.66T \qquad (4).$$

Moreover, the computed value of 0.66 T is the boundary point of the normal state and the stuck lock state as shown in FIG. 5.

In the present embodiment, a cycle of the reset signal RB is the same as a cycle of the reference clock signal FREF, and the reset signal RB is enabled by a pulse of logic 0. As shown by FIGS. 8-10, in order to ensure the AFL circuit 440 properly operates, the reset signal RB must be enabled once in each cycle. Furthermore, the enabling of the reset signal RB must be earlier than all of the strobe clock signals PHS. Thereby, the reset signal RB can initialize the outputs of the serial storage units 601-603 at the correct time, and thus prevent erroneous decisions due to a previous residue memory.

Figure 11:
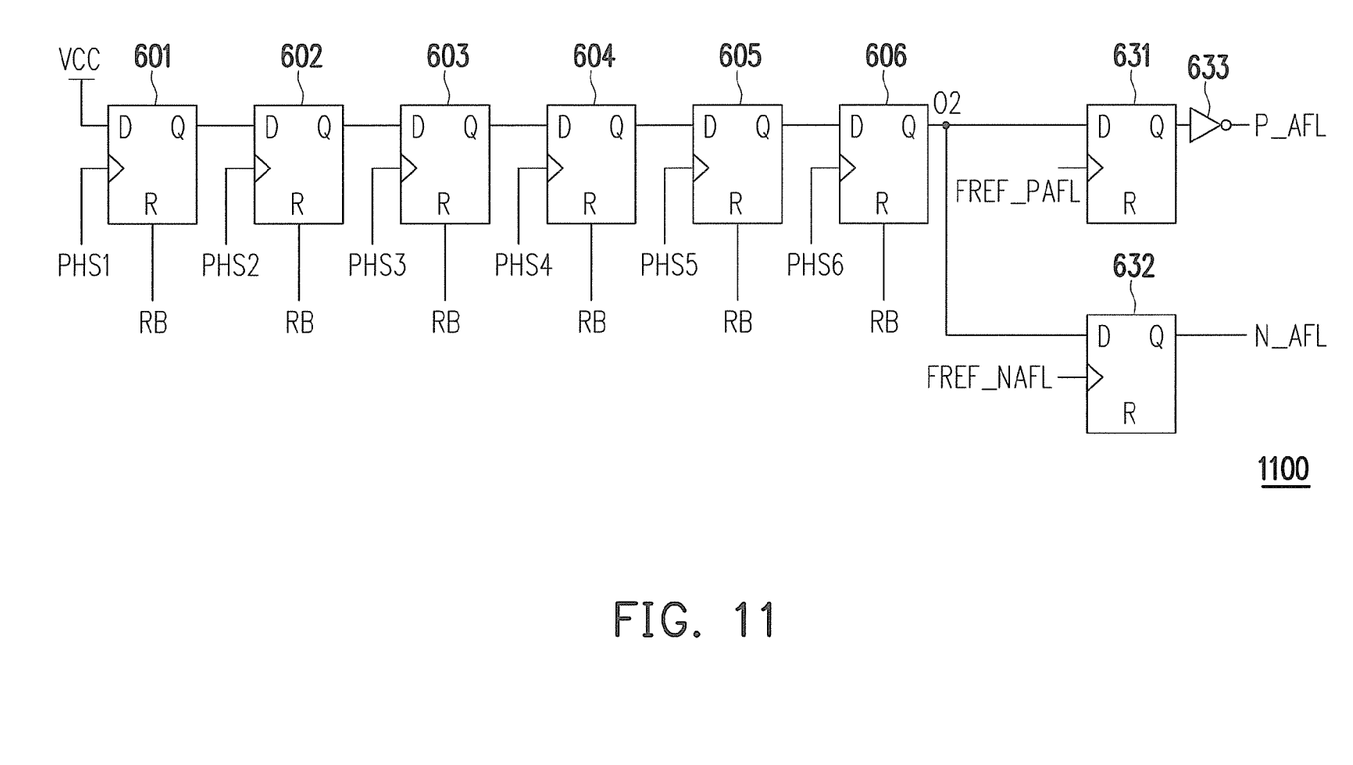
FIG. 11 is a schematic diagram of an AFL circuit according to another embodiment of the invention.
Figure 12:
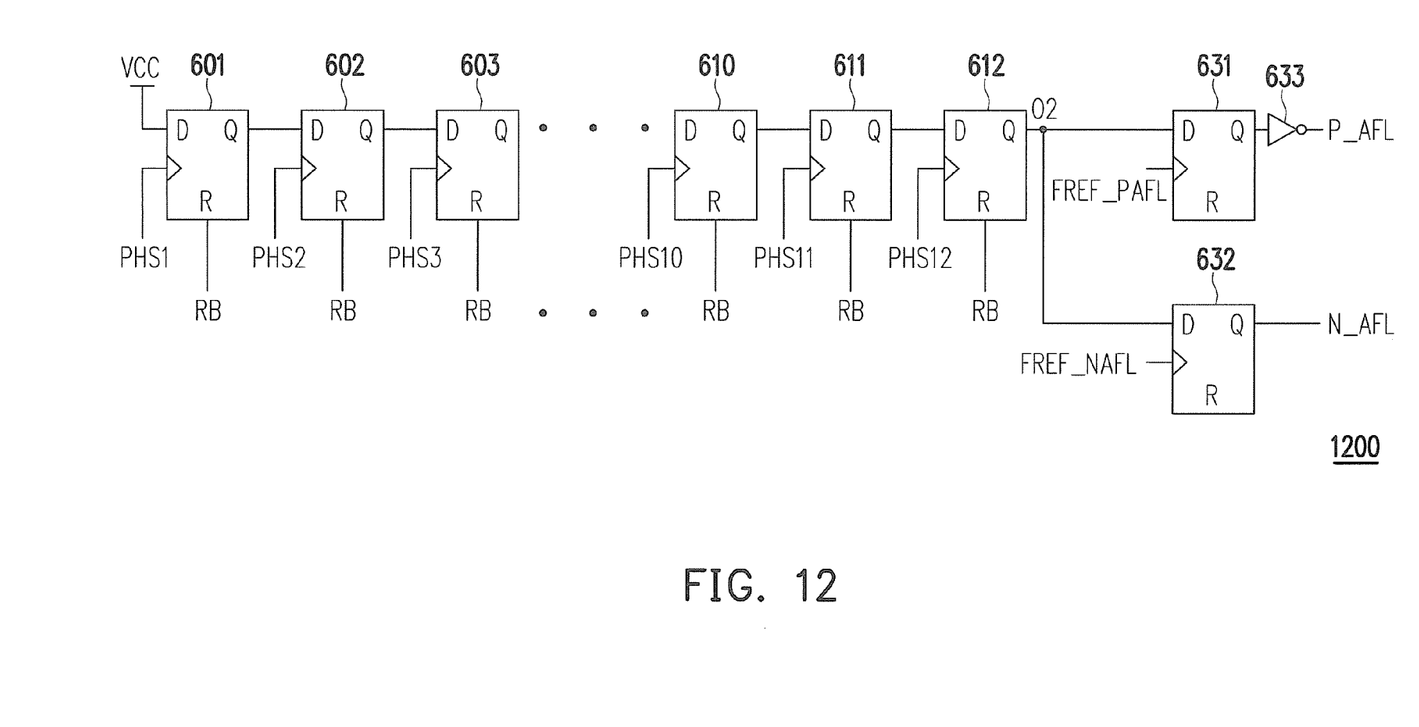
FIG. 12 is a schematic diagram of an AFL circuit according to another embodiment of the invention.

The AFL circuit according to embodiments of the invention has a plurality of possible variations. For example, FIGS. 11 and 12 illustrate two variations of the AFL circuit. An AFL circuit 1100 depicted in FIG. 11 has six serial storage units 601-606, and the rest of the elements in FIG. 11 are the same as the AFL circuit 440 depicted in FIG. 6. Moreover, the delay time of the strobe clock signal PHS1 is $\frac{1}{8}$ of the output clock signal CKOUT, the delay time of the strobe clock signal PHS2 is $\frac{2}{8}$ of the output clock signal CKOUT, the delay time of the strobe clock signal PHS3 is $\frac{3}{8}$ of the output clock signal CKOUT, and so on. An AFL circuit 1200 depicted in FIG. 12 has twelve serial storage units 601-612, and the rest of the elements in FIG. 12 are the same as the AFL circuit 440 depicted in FIG. 6. Moreover, the delay time of the strobe clock signal PHS1 is $\frac{1}{16}$ of the output clock signal CKOUT, the delay time of the strobe clock signal PHS2 is $\frac{2}{16}$ of the output clock signal CKOUT, the delay time of the strobe clock signal PHS3 is $\frac{3}{16}$ of the output clock signal CKOUT, and so on.

Generally speaking, an AFL circuit according to embodiments of the invention may include N serial storage units. Moreover, the delay time of the $i^{th}$ serial storage unit is $i/(N*4/3)$ of the delay time of the output clock signal CKOUT, in which i is an integer and $1 \leq i \leq N$. N may be any integer greater than or equal to 3, and not limited to powers of 2. For example, numbers such as 3, 7, and 10 are all acceptable. The specific numeric value of N can be decided by a designer. The operable range of the DLL using these AFL circuits is between 0 to $N*(4/3)*T$. In other words, as long as the delay time of the output clock signal CKOUT relative to the reference clock signal FREF is within the range of 0 to $N*(4/3)*T$, the output clock signal CKOUT can be locked to a preset delay time of 1 T.

In order for proper operation of the DLL, the false lock detection range must be linked with the operable range of the phase detector 410. When the operable range of the phase detector 410 is between $T_{PD1}$ to $T_{PD2}$ (e.g., 0.5 T to 1.5 T as shown in FIG. 5), a delay time boundary point $T_{AFL2}$ of the normal state and the harmonic lock state of the comparison signal CMP2 must be less than an operable upper limit delay $T_{PD2}$ of the phase detector 410. Moreover, a delay time boundary point $T_{AFL1}$ of the normal state and the stuck lock state of the comparison signal CMP2 must be greater than an operable lower limit delay $T_{PD1}$ of the phase detector 410. As shown by formulas (1) to (4) above, when the delay time of the strobe clock signal received by the last serial storage unit of the AFL circuit is $i/(N*4/3)$ of the output clock signal CKOUT, and the delay times of the clock signals FREF_PAFL and FREF_NAFL are respectively $T_P$ and $T_N$, then the delays times of the boundary points $T_{AFL1}$ and $T_{AFL2}$ are respectively $((N*4/3)/i)*T_N$ and $((N*4/3)/i)*T_P$. The boundary points $T_{AFL1}$ and $T_{AFL2}$ define the false lock detection range of the AFL circuit.

In light of the above, factors influencing the false lock detection range include the delay time of the strobe clock signal received by the last serial storage unit of the AFL circuit, and the delay times of the clock signals FREF_PAFL and FREF_NAFL. The delay times of the clock signals FREF_PAFL and FREF_NAFL may be modified by adjusting the buffer 710 of the signal generating unit 640.

The afore-described embodiments include a plurality of circuit signals. Moreover, the enabled states of some signals are represented by the voltage levels of logic 1 or logic 0, the enabling operation of some signals is represented by the rising edge from logic 0 to logic 1, while the enabling operation of some signals is represented by pulses. The enabling mechanisms of the afore-described signals are merely exemplary, and therefore should not be construed as limiting the spirit and scope of the invention. The key is in the functions or the responses triggered by the enabled states or the enabling operations of the signals, and not in the particulars of the how to represent the enabled states or operations.

In view of the foregoing, embodiments of the invention can effectively prevent a harmonic lock and a stuck lock from occurring in a DLL. The AFL circuit described in embodiments of the invention can be designed to have a flexible false lock detection range and operable range. The reset signal of the AFL circuit can prevent erroneous decisions, and therefore the robustness of the DLL is enhanced. The AFL circuit according to embodiments of the invention is structurally simple and compact. Therefore, the AFL circuit can lower the complexity and cost of the whole circuit, making the AFL circuit suitable for high speed applications.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A delay-locked loop (DLL) receiving a reference clock signal and outputting an output clock signal, comprising:
    a phase detector outputting a first comparison signal according to a phase comparison between the reference clock signal and the output clock signal;
    a delay chain generating a plurality of strobe clock signals and the output clock signal by delaying the reference clock signal;
    an anti-false lock (AFL) circuit outputting a second comparison signal according to a phase comparison between the reference clock signal and the strobe clock signals; and
    a loop filter controlling a delay time of the output clock signal according to the first and the second comparison signals in order to lock the delay time of the output clock signal at a preset value.

2. The DLL as claimed in claim 1, wherein the preset value is equal to a cycle of the reference clock signal.

3. The DLL as claimed in claim 1, wherein the AFL circuit comprises:
    a plurality of serial storage units, wherein each of the serial storage units receives one of the strobe clock signals and an input signal, and stores the input signal when the strobe clock signal is enabled, the input signal of the first serial storage unit being a preset voltage, the input signal received by each of the other serial storage units being the input signal stored by the previous serial storage unit, and the input signal stored by the last serial storage unit being outputted as an internal signal;
    an signal generating unit generating a first clock signal and a second clock signal by delaying the reference clock signal for different intervals;
    a first storage unit receiving the internal signal and the first clock signal and storing the internal signal when the first clock signal is enabled; and
    a second storage unit receiving the internal signal and the second clock signal and storing the internal signal when the second clock signal is enabled, wherein the second comparison signal is generated according to the internal signal stored by the first storage unit and the internal signal stored by the second storage unit.

4. The DLL as claimed in claim 3, wherein the second comparison signal comprises a harmonic lock signal and a stuck lock signal, the harmonic lock signal being the internal signal stored by the first storage unit or an inverted signal of the internal signal stored by the first storage unit, and the stuck lock signal being the internal signal stored by the second storage unit or an inverted signal of the internal signal stored by the second storage unit.

5. The DLL as claimed in claim 4, wherein when the harmonic lock signal and the stuck lock signal are both disabled, the second comparison signal is in a normal state; when the harmonic lock signal is enabled the stuck lock signal is disabled, the second comparison signal is in a harmonic lock state; and when the harmonic lock signal is disabled the stuck lock signal is enabled, the second comparison signal is in a stuck lock state.

6. The DLL as claimed in claim 5, wherein when the second comparison signal is in the harmonic lock state, the loop filter shortens the delay time of the output clock signal until the second comparison signal is in the normal state; when the second comparison signal is in the stuck lock state, the loop filter elongates the delay time of the output clock signal until the second comparison signal is in the normal state; and when the second comparison signal is in the normal state, the loop filter controls the delay time of the output clock signal according to the first comparison signal in order to lock the delay time of the output clock signal at the preset value.

7. The DLL as claimed in claim 5, wherein a delay time boundary point of the normal state and the harmonic lock state of the second comparison signal is less than an operable upper limit delay of the phase detector, and a delay time boundary point of the normal state and the stuck lock state of the second comparison signal is greater than an operable lower limit delay of the phase detector.

8. The DLL as claimed in claim 3, wherein a delay time of the first clock signal is a cycle of the reference clock signal, and a delay time of the second clock signal is a half cycle of the reference clock signal.

9. The DLL as claimed in claim 8, wherein the signal generating unit outputs a reset signal, and each of the serial storage units resets the input signal stored therein when the reset signal is enabled.

10. The DLL as claimed in claim 9, wherein a cycle of the reset signal is the same as the cycle of the reference clock signal, the reset signal is enabled once in each cycle, and the reset signal is enabled earlier than all of the strobe clock signals.

11. The DLL as claimed in claim 9, wherein the signal generating unit comprises:
   a buffer receiving the reference clock signal and outputting the first clock signal;
   an inverter receiving the first clock signal and outputting the second clock signal; and
   an NAND gate receiving the second clock signal and the reference clock signal and outputting the reset signal.

12. The DLL as claimed in claim 3, wherein a delay time of the $i^{th}$ serial storage unit is $i/(N*4/3)$ of the delay time of the output clock signal, N being an integer greater than or equal to 3, i being an integer and $1 \leq i \leq N$, and a quantity of the serial storage units being N.

13. The DLL as claimed in claim 3, wherein each of the serial storage units, the first storage unit, and the second storage unit is a D flip-flop, a latch, or a sample-and-hold circuit.

* * * * *